United States Patent
Kocaman et al.

(10) Patent No.: US 6,424,230 B1
(45) Date of Patent: Jul. 23, 2002

(54) LOOP STABILIZATION TECHNIQUE IN A PHASE LOCKED LOOP (PLL) WITH AMPLITUDE COMPENSATION

(75) Inventors: Namik K. Kocaman, Rancho Cordova; Michael W. Altmann, Folsom, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/676,524

(22) Filed: Sep. 29, 2000

(51) Int. Cl.[7] .............................. H03L 7/089; H03L 7/08
(52) U.S. Cl. ......................... 331/15; 331/175; 331/17; 331/16
(58) Field of Search ............................... 331/15, 11, 14, 331/17, 16, 175, 182

(56) References Cited

U.S. PATENT DOCUMENTS 5,923,707 A * 7/1999 Tanaka et al. ............... 375/232

* cited by examiner

Primary Examiner—Arnold Kinkead
(74) Attorney, Agent, or Firm—Blakely, Sokoloff, Taylor & Zafman LLP

(57) ABSTRACT

A phase locked loop circuit and method that substantially decouples control of the phase/frequency and the amplitude of the oscillation output such that the frequency of the oscillation can be controlled independently of the amplitude. The phase locked loop circuit comprises a phase/frequency control loop and an amplitude control loop wherein both loops control an oscillator that oscillates at a certain frequency in response to a phase/frequency control signal generated by the phase/frequency control loop. In addition, the oscillation amplitude is determined by an amplitude control signal generated by the amplitude control loop. As with conventional circuits of this type, a parasitic gain is coupled from the amplitude control loop into the phase/frequency control loop, thereby causing interference between the loops that leads to stability problems. To counter the coupling of the parasitic gain, an inverted gain is inserted from the amplitude control loop into the phase/frequency control loop in opposite to the parasitic gain, so as to effectively cancel the interference. The circuit and method also provide for canceling the opposite parasitic gain that is coupled from the phase/frequency loop into the amplitude control loop.

17 Claims, 8 Drawing Sheets

LOOP STABILIZATION TECHNIQUE IN A PHASE LOCKED LOOP (PLL) WITH AMPLITUDE COMPENSATION

BACKGROUND OF THE INVENTION

1. Field of the Invention

The present invention generally concerns the control of a phase locked loop (PLL), and in more particular concerns the simultaneous control of frequency and amplitude in a PLL.

2. Background Information

Amplitude control of an oscillator over process, temperature, and power supply variations is a challenging task in PLL design. Uncontrolled oscillation amplitude can be a source of additional jitter due to changing operating points and cyclostationary device noises. Another application that requires amplitude control in PLLs is the master-slave tuning in on-chip filters. Oscillation amplitude of the PLL should match with the signal amplitude processed in the filter to avoid distortion that causes frequency errors. However, active amplitude compensation incorporated into a PLL can be a major problem of stability. Consider a gm-C (transconductance-Cell) based relaxation type oscillator. The loop introduced to control amplitude interferes with the main phase/frequency locking loop. The mechanism that adjusts the amplitude, i.e., the current of the negative gm load of the oscillator where the negative gm load is used to compensate for resistive losses, initiates the oscillation cycle as well as sets the oscillation amplitude, thereby imposing an inverse force that causes the two loops that fight each other, wherein precise control of one of the loops has an adverse effect on the control of the other loop. The traditional solution to minimize the problem is to maximize the difference between time constants governing the amplitude and phase/frequency locking loops. Basically, the amplitude loop should be slowed down by using large component values, such as huge capacitors, which consumes more area and power than desired. Still, the system should be overdesigned to have enough margin to accommodate not only the environmental variables, but also component values especially for large time constants.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
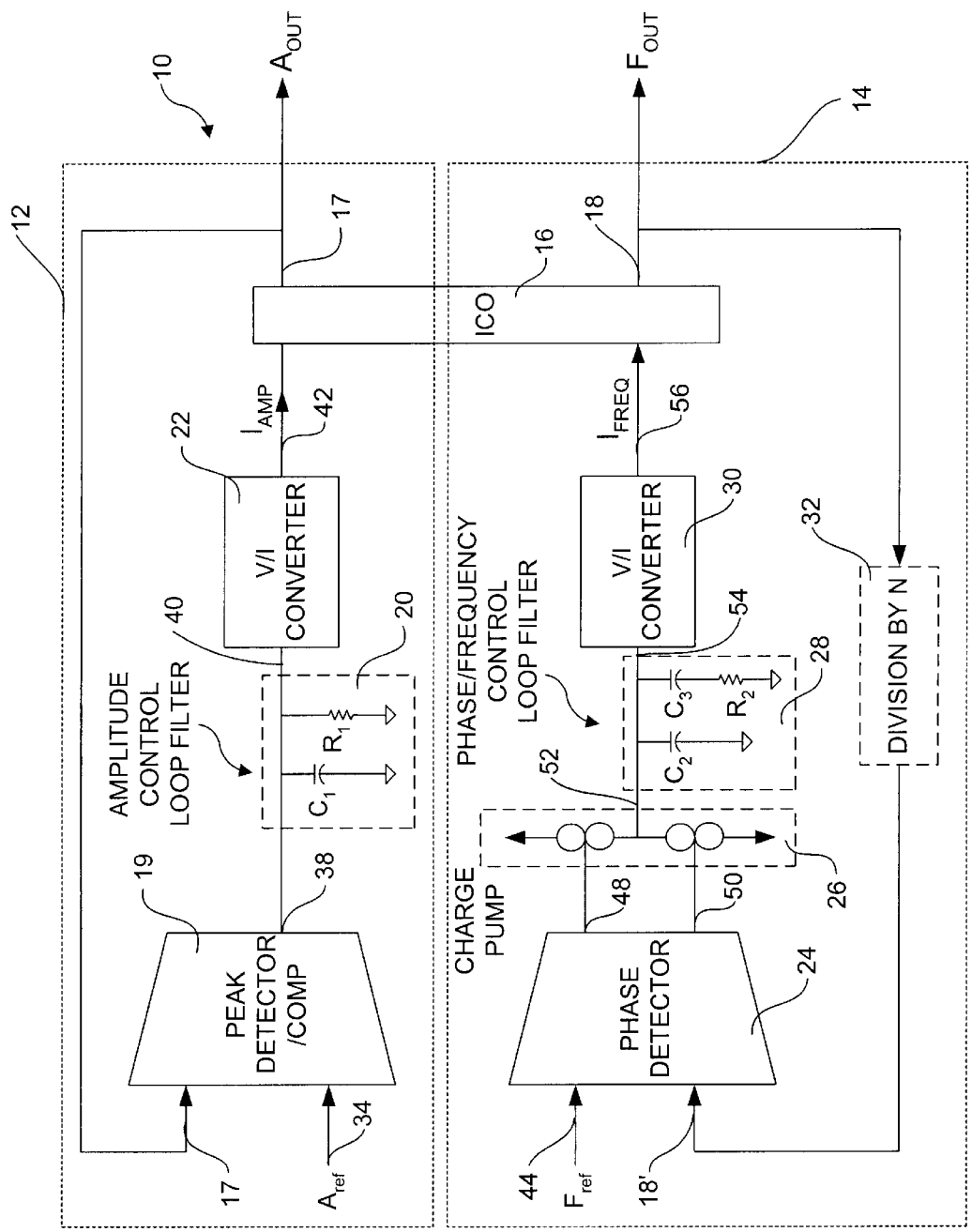
FIG. 1 is a schematic block diagram of a conventional charge pump PLL with amplitude control.

A conventional charge pump based PLL system 10 that includes amplitude control is depicted in FIG. 1. PLL system 10 comprises an amplitude control loop 12 and a phase/frequency control loop 14 that provide a pair of input signals to a current-controlled oscillator (ICO) 16 that is common to both control loops. As will be understood by those skilled in the art, although two separate lines corresponding to an amplitude output signal 17 ($A_{out}$) and a frequency output signal 18 ($F_{out}$) are shown in FIG. 1, $A_{out}$ and $F_{out}$ represent components of a single composite signal that is output by ICO 16. Amplitude control loop 12 includes a peak detector/comparator 19, an amplitude loop filter 20, a voltage-to-current converter 22, and current-controlled oscillator (ICO) 16. Phase/frequency control loop 14 includes a phase detector 24, a charge pump 26, a frequency loop filter 28, a voltage-to-current converter 30, ICO 16, and an optional frequency divider 32. If frequency divider 32 is used, frequency output signal 18 becomes frequency output signal 18' after its frequency is divided.

Amplitude control loop 12 works in the following manner. The loop receives an amplitude reference signal 34 that is compared to amplitude output signal 17 of the loop by peak detector/comparator 19. Peak detector/comparator 19 produces a current output signal 38 based on a difference in the amplitude of amplitude reference single 34 and amplitude output signal 17, which is then filtered by amplitude loop filter 20 through means of passive filter elements $C_1$ and $R_1$ to produce an amplitude control voltage 40. Amplitude control voltage 40 is then fed into voltage-to-current converter 22, which outputs an amplitude control current 42 that provides an input to ICO 16 to produce amplitude output signal 17.

Phase/frequency control loop 14 works in a similar manner. The loop receives a frequency reference input signal 44 that is compared with frequency output signal 18' in phase detector 24. Phase detector 24 outputs a pair of control signals 48 and 50 that are fed into charge pump 26, which pumps a current 52 that is proportional to the phase difference between signal 44 and 18'. Then current 52 is filtered by phase/frequency loop filter 28 through means of passive elements $C_2$, $C_3$, and $R_2$ to produce a frequency control voltage 54. Frequency control voltage 54 is then fed into voltage-to-current converter 30, which outputs a frequency control current signal 56 that drives ICO 16.

Different architectures can be used to realize the amplitude and phase/frequency controls in PLLs. Depending on the variables that change frequency and amplitude of the oscillation, there might be less interaction, but nevertheless, it is very unlikely to eliminate the coupling entirely, especially for the jitter requirements of recent PLL systems.

Figure 2:
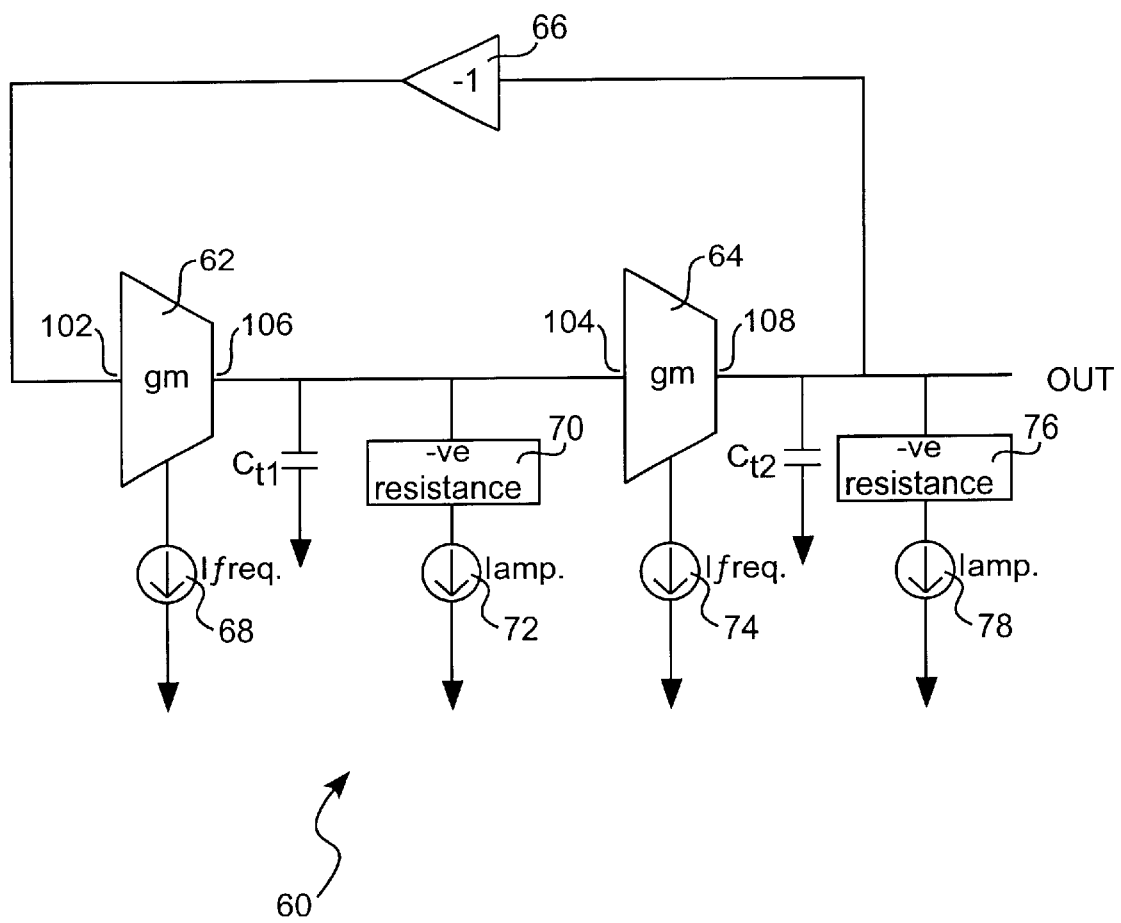
FIG. 2 is a schematic block diagram of a gm-C based relaxation-type oscillator.
Figure 3:
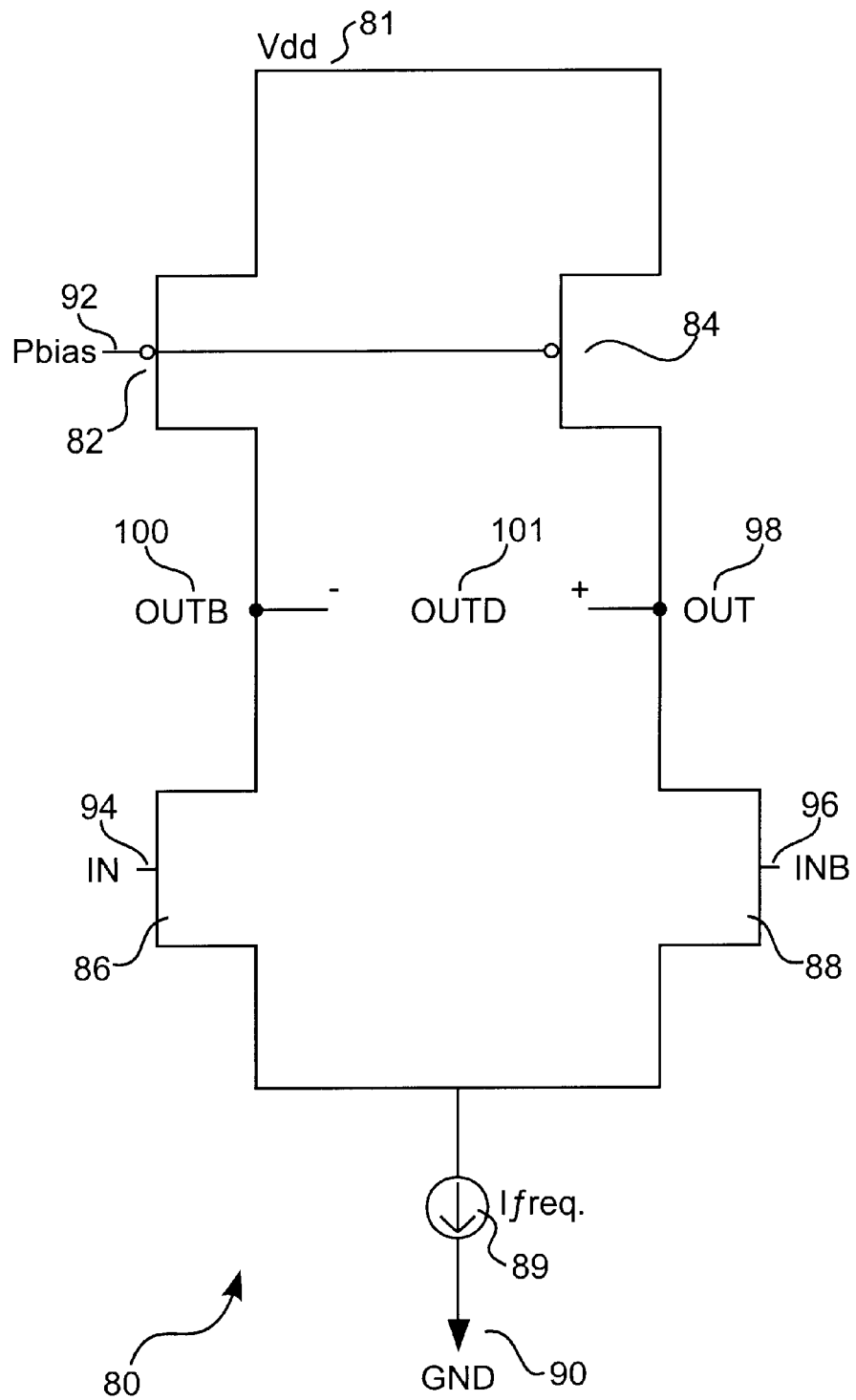
FIG. 3 is a schematic diagram of an exemplary circuit structure that may be used for a transconductance (gm) stage.
Figure 4:
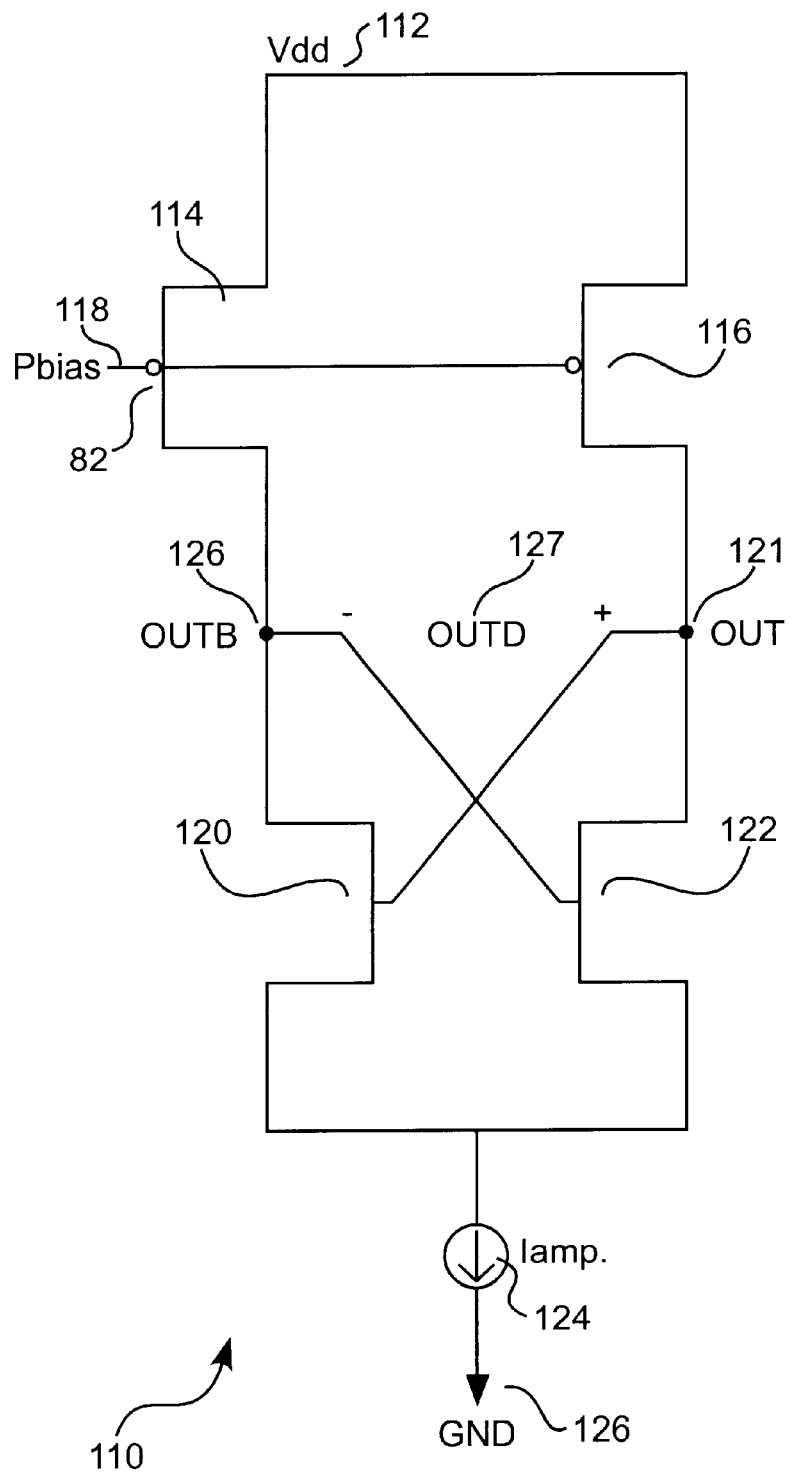
FIG. 4 is a schematic diagram of an exemplary circuit structure that may be used to provide a negative resistance.

With reference to FIG. 2, a gm (transconductance)-C based relaxation type oscillator 60 is depicted that might typically be used as a low-cost current controlled oscillator (ICO) in the circuitry shown in FIG. 1. Gm-C oscillator 60 comprises two cascaded gm stages that provide a 180 degree phase shift, including a first gm stage 62 and a second gm stage 64. The output of second gm stage 64 is then inverted, as depicted by an inverter block 66, and fed back as the input of first gm stage 62. Gm-C oscillator 60 further comprises a first stage frequency current source 68, a first stage capacitor $C_{t1}$, a first stage negative resistance 70, a first stage amplitude current source 72, a second stage frequency current source 74, a second stage capacitor $C_{t2}$, a second stage negative resistance 76, and a second stage amplitude current source 78. Negative resistances 70 and 76 are included at the output of each stage to compensate for the output conductance losses. Circuit structures associated with the gm stage and negative resistance are illustrated in FIGS. 3 and 4, respectively, further details of which are provided below.

In the ideal case, the output signal frequency $F_{out}$ would be directly controlled by the frequency control current $I_{freq}$, such that, $$F_{out} = \mathcal{R}(I_{freq}) \tag{1}$$

and the output signal amplitude $A_{out}$ would be directly controlled by the amplitude control current $I_{amp}$, such that, $$A_{out} = \mathcal{G}(I_{amp}) \tag{2}$$

However, as discussed above, the control of one parameter adversely affects the control of the other parameter, such that, $$F_{out} = \mathcal{R}(I_{freq}) + \mathcal{R}(I_{amp}) \tag{3}$$

and $$A_{out} = \mathcal{G}(I_{amp}) + \mathcal{G}(I_{freq}) \tag{4}$$

This occurs due to the following interactions. In the phase/frequency loop, the tail currents ($I_{freq}$) of the gm stages that drive the oscillation can be used to change the transconductance of the stages. As a first order relation, frequency of oscillation depends on $gm/C_t$ where $C_t$ is the total capacitance at the output of the gm stage. Negative resistance at the output of each gm stage can be realized by implementing a cross-coupled pair, such as shown in FIG. 4 and described in further detail below. Tail current ($I_{amp}$) of the cross-coupled pair adjusts ($V_{gs}-V_t$) of the transistors, which makes the cross-coupled pair. This parameter ($V_{gs}-V_t$) limits the oscillation amplitude. On the other hand, ($V_{gs}-V_t$) affects the average transconductance of the gm stage within a single oscillation cycle because the gm stage exhibits a limited region of linearity. As the amplitude of oscillation reaches the linearity boundaries, the instantaneous gm decreases, vanishes, and then starts to increase with opposite polarity to pursue the other phase of the oscillation cycle. Accordingly, $I_{amp}$ interferes into the phase/frequency loop. In general, an increase in amplitude decreases the frequency. Furthermore, $I_{freq}$ contributes to amplitude changes through the dependency of output conductance of a MOS transistor on its channel current. As output conductance varies due to $I_{freq}$, it adversely affects the amplitude loop. The relative strength of these interactions depends heavily on loop bandwidths, operating points, and basic transistor parameters such as gm, gds, and ($V_{gs}-V_t$), all of which typically are changing dynamically.

This cross coupling between the loops can introduce right half plane poles into the PLL system given the dynamic nature of loop variables. In the present invention, $I_{amp}$ is inserted into phase/frequency control loop 14 to cancel the coupling path coming from amplitude control loop 12. The basic idea can be formulated as follows;

$$\mathcal{R}_{out} = \mathcal{R}(I_{freq}) + \mathcal{G}(I_{amp}) \tag{5}$$

Instead, one can utilize;

$$\mathcal{R}_{out} = \mathcal{R}(I_{freq} + kI_{amp}) + \mathcal{G}I_{amp}) \approx \mathcal{R}(I_{freq}) \tag{6}$$

Even though the cancellation may not be complete, it gives the flexibility to accommodate a larger range of variations to the system to reduce the complexity of over-design.

An exemplary circuit structure 80 that may be used for a typical gm stage is shown in FIG. 3. Current for driving circuit structure 80 is provided by a "Vdd" supply 81, which supplies current to the sources of a pair of PMOS transistors 82 and 84, the drains of which are connected to the drains of respective NMOS transistors 86 and 88. The sources of NMOS transistors 86 and 88 are commonly tied to the high side of a current source 89 (corresponding to first and second stage frequency current sources 68, 74), which is tied to a ground 90. A "Pbias" signal 92 is provided to the gates of each of PMOS transistors 82 and 84 and is maintained at a voltage level such that both PMOS transistors 82 and 84 are saturated throughout the oscillations of the circuit. As a result, PMOS transistors behave as if they were pull-up resistors to Vdd, which may be substituted in place of the PMOS transistors in an optional configuration. If PMOS transistors are used, the circuit is referred to as a source-coupled pair with PMOS loads. In general, a source-coupled pair with resistive loads may also be used.

The behaviors of NMOS transistors 86 and 88 are controlled by a pair of complimented control signals, including an "in" signal 94 and an inb(bar) signal 96, which are provided to the gates of NMOS transistors 86 and 88, respectively. In addition, circuit structure 80 provides a pair of complimented output signals "out" 98 and "outb" 100 between the PMOS and NMOS transistors on opposing branches of the circuit. With respect to the circuit of FIG. 2, "in" signal 94 corresponds to input signals 102 and 104, which are respectively received by first and second stages 62 and 64, while "out" signal 98 corresponds the outputs of the respective stages, labeled 106 and 108. Additionally, "outd" 101 represents the differential voltage across complimented output signals "out" 98 and "outb" 100.

An exemplary circuit structure 110 comprising a cross-coupled pair with PMOS or resistive loads that may be used for negative resistances 70 and 76 is shown in FIG. 4. This circuit structure is substantially similar to circuit structure 80 of FIG. 3, and includes a Vdd supply 112, PMOS transistors 114 and 116, each of which is provided with a "Pbias" signal 118 at their respective gates, and NMOS transistors 120 and 122. The sources of NMOS transistors 120 and 122 are commonly tied to the high side of a current source 124 (e.g., amplitude control current sources 72 and 78 of FIG. 3) that is tied to a ground 126. Furthermore, PMOS transistors 114 and 116 behave in a similar manner to the PMOS transistors of circuit structure 80, wherein Pbias signal 118 is set at a voltage such that the PMOS transistors are continuously saturated and behave as resistors. Accordingly, as with the circuit structure 80, pull-up resistors may be substituted in place of the PMOS transistors.

A primary difference between circuit structures 80 and 110 is how the NMOS transistors are controlled. As depicted in FIG. 4, the control signals for NMOS transistors 120 and 122 are respectively provided by complimented gm stage output signals "out" 121 and "outb" 126, which cross across the opposing branches of the circuit structure, to form the cross coupled pair. Similar to circuit 80, the differential voltage across complimented output signals "out" 121 and "outb" 126 corresponds to an "outd" signal 127.

Figure 5:
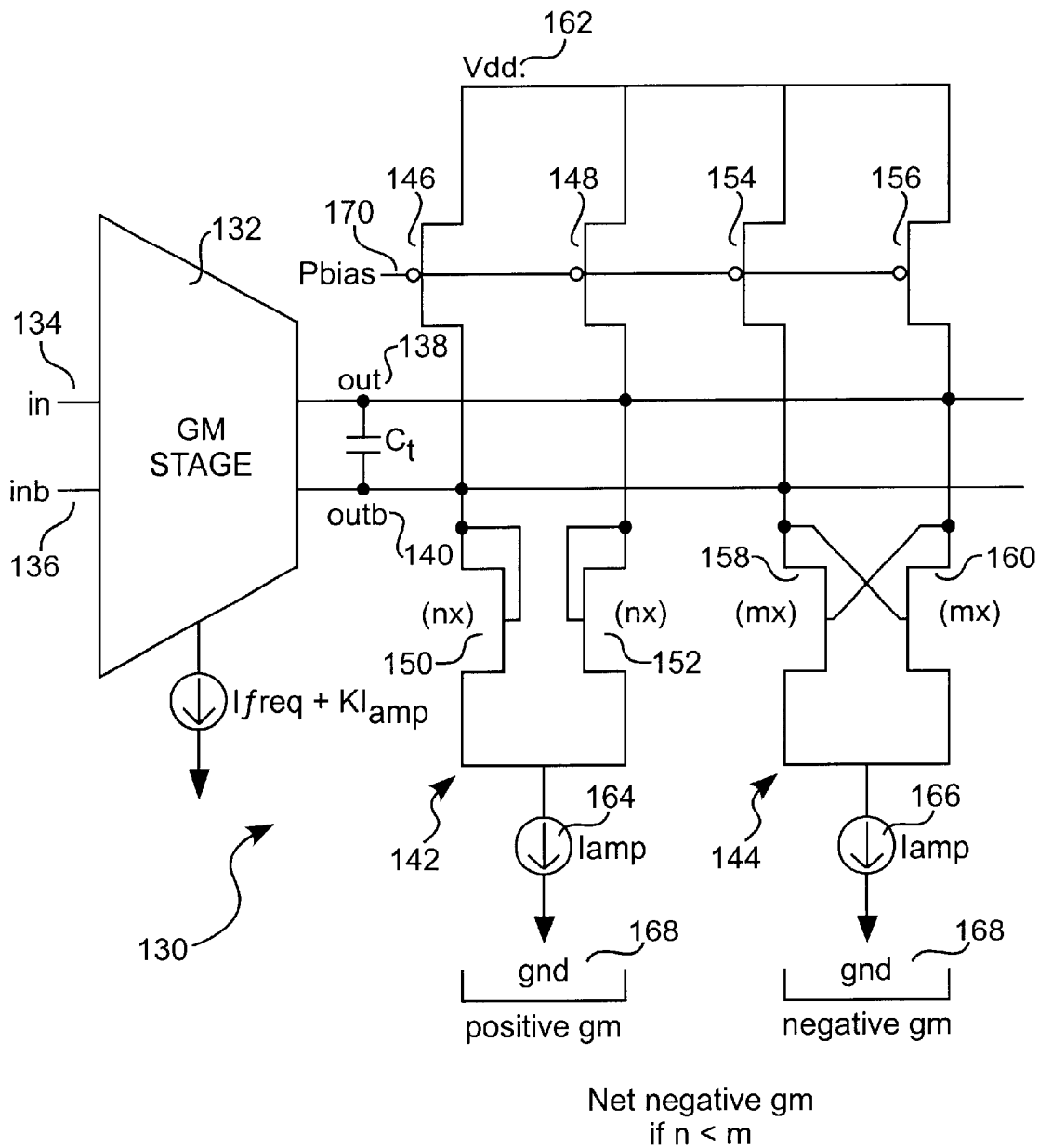
FIG. 5 is a schematic diagram of an exemplary circuit structure that may be used for a gm stage loaded with $C_t$ and net negative resistance.

An exemplary circuit 130 that may be used in implementing the present invention that provides the gm stage loaded with $C_t$ and net negative resistance through combining circuits that produce positive and negative gms is shown in FIG. 5. Circuit 130 includes a gm stage 132, preferably comprising circuitry in accord with circuit structure 80 of FIG. 3. Gm stage 132 receives a pair of complimented input signals "in" 134 and "inb" 136, and produces a pair of complimented output signals "out" 138 and "outb" 140. A capacitor $C_t$ is tied across the complimented output signals. The output signals are used to drive a source-coupled diode connected pair with PMOS loads circuit 142 and a cross-coupled pair with PMOS loads circuit 144.

Circuit 142 comprises a pair of PMOS transistors 146 and 148, and n pairs of NMOS transistors 150 and 152. Similarly, circuit 144 comprises a pair of PMOS transistors 154 and 156 and m pairs of NMOS transistors 158 and 160. The sources of each of the PMOS transistors is commonly tied to a Vdd supply 162, while the sources of NMOS transistors 150 and 152 are connected to the high side of an amplitude control current source 164 and the sources of NMOS transistors 158 and 160 are tied to the high side of an amplitude control current source 166. Each of current sources 164 and 166 provide substantially the same current are tied to a common ground 168. In addition, a Pbias signal 170 is provided to the gates of each of PMOS transistors 146, 148, 154 and 156 such that each of these PMOS transistors is saturated and behaves as a resistor. As with the foregoing circuits, the PMOS transistors may be replaced with pull-up resistors.

Note the difference in how NMOS transistors 150, 152 of circuit 142 are connected when compared with NMOS transistors 158, 160 of circuit 144. In circuit 142, the NMOS transistors are diode connected, wherein the drain of each transistor is tied to the gate of the transistor. In contrast, the drains of NMOS transistors 158 and 160 are tied to gates of the opposite transistor on a pair-wise basis, such that the drain of transistor 158 is tied to the gate of transistor 160, and the drain of transistor 160 is tied to the gate of transistor 158. Accordingly, circuit 144 is a cross-coupled circuit comprising m pairs of cross-coupled NMOS transistors.

It is noted that there respectively are n and m sets of NMOS transistors for circuits 142 and 144. The reason for this is to have a net negative gm depending on relative differences rather than absolute values, which makes variations less severe over process, temperature, and supply voltages.

Suppose that all of the NMOS transistors have substantially the same characteristics. Therefore, as depicted in FIG. 5, circuit 142 produces a positive gm that is a function of n, the number of pairs of transistors 150 and 152, while circuit 144 produces a negative gm that is a function of m, the number of pairs of transistors 158 and 160. The overall effect, identified as the NET gm, will be negative if the following condition is met:

$$NETgm = (n-m)gm < 0 \text{ for } m > n \tag{7}$$

Accordingly, the scaling factor can be adjusted by varying the values for n and m. Optionally, the scaling factors can be adjusted by simply adjusting the length and/or width of the NMOS transistors.

Figure 6:
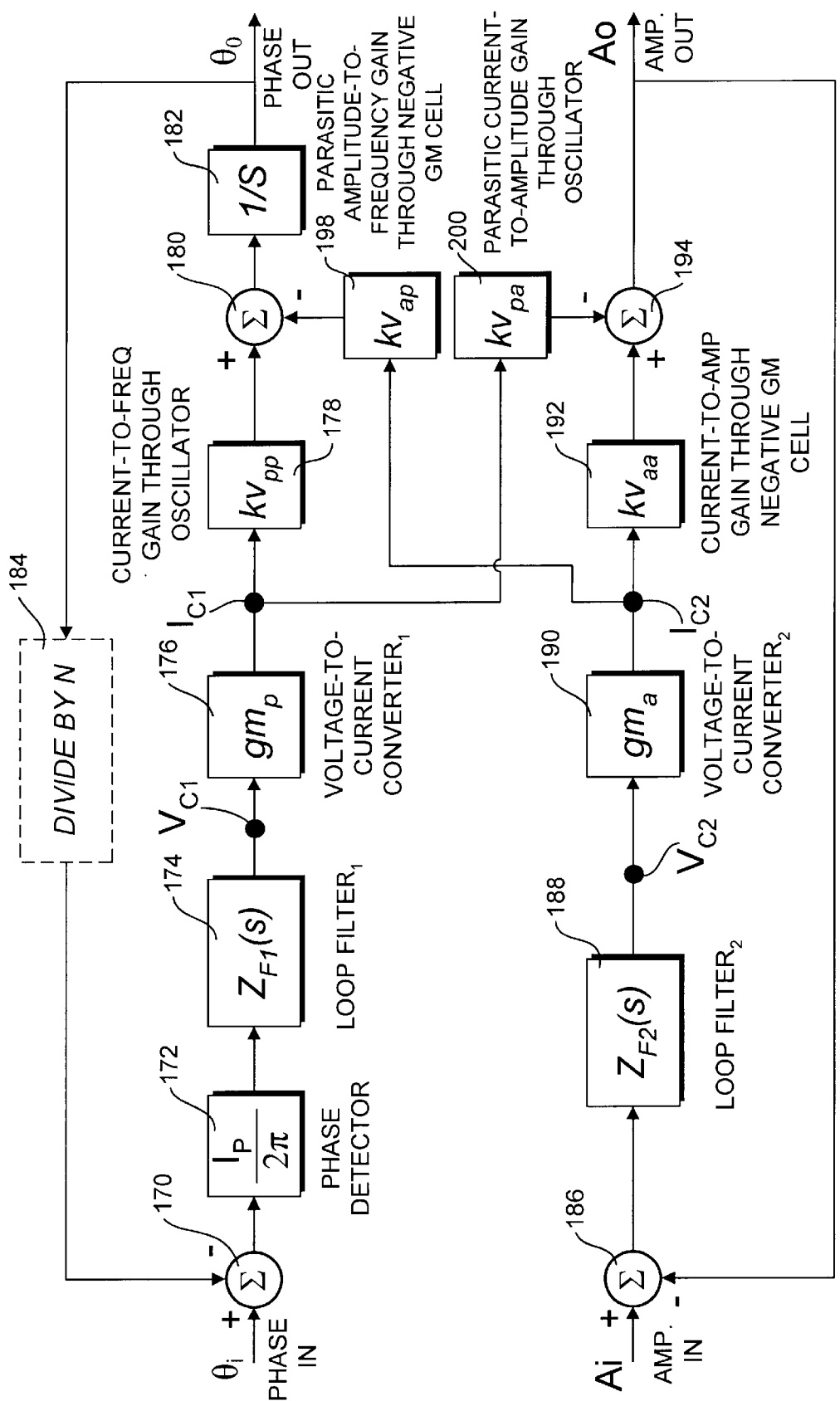
FIG. 6 is a schematic block diagram for modeling the behavior of the conventional charge pump PLL of FIG. 1.
Figure 7:
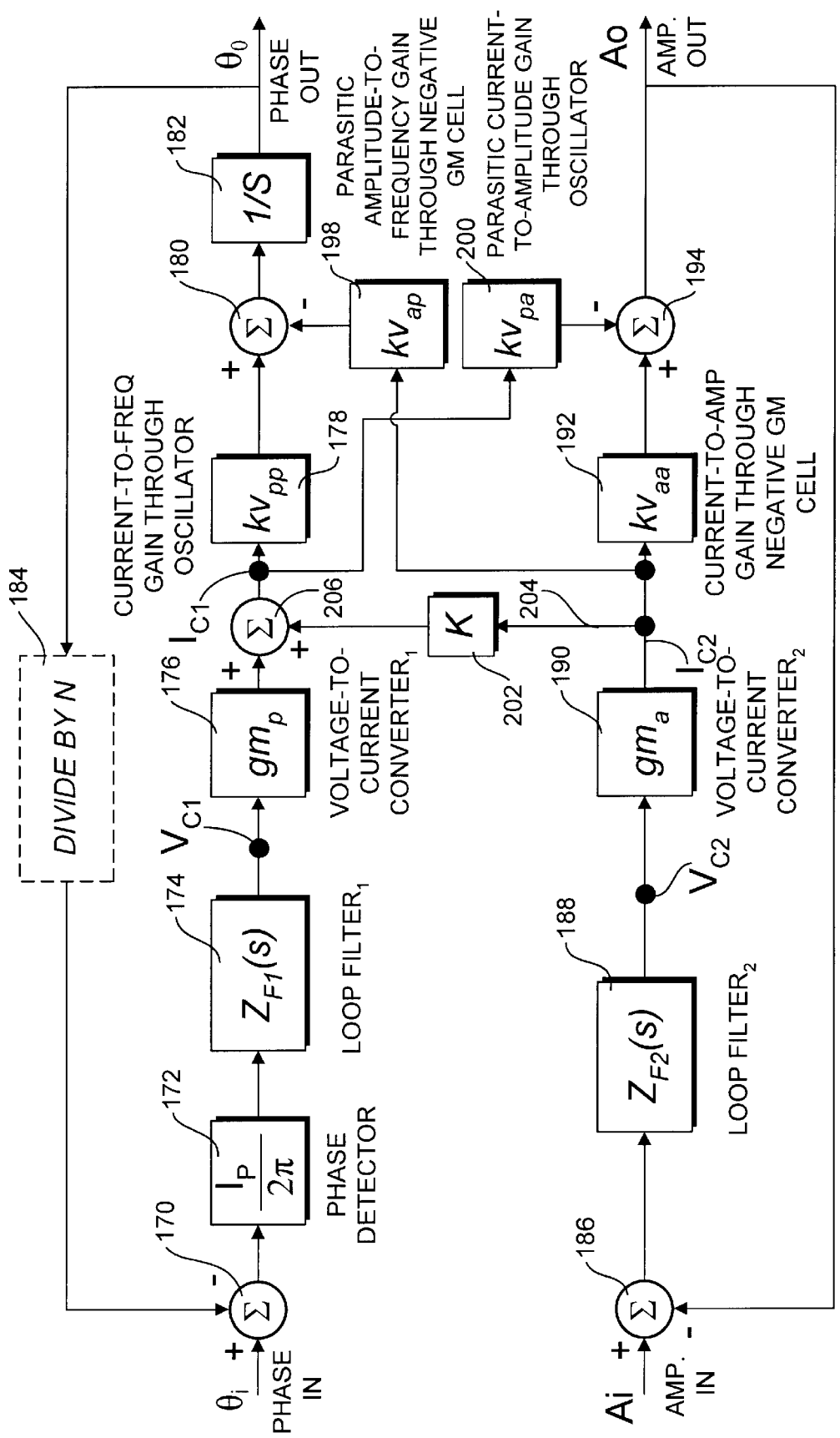
FIG. 7 is a schematic block diagram for modeling the behavior of a modified charge pump PLL circuit in accord with a first exemplary implementation of the present invention.

Block diagrams that model the behavior of the foregoing circuitry are shown in FIGS. 6 and 7. The block diagram of FIG. 6 models the phase/frequency (the upper) and amplitude (the lower) control loops and the cross-coupling between the loops in accord with the conventional PLL circuitry of FIG. 1. The phase/frequency control loop model includes a summing block 170, a phase detector block 172, a loop filter block 174, a voltage-to-current converter gm block 176, a current-to-frequency transfer function block 178, a summing block 180, and an integration block 182. The phase/frequency control loop may optionally include a frequency divider, modeled by a divide-by-n block 184.

The amplitude control loop model includes a summing block 186, a loop filter block 188, a voltage-to-current converter block 190, a current-to-amplitude transfer function block 192, and a summing block 194. In addition to the respective blocks of each loop, the cross coupling between the loops is modeled using a parasitic amplitude-to-frequency gain ($kv_{ap}$) block 198 and a parasitic frequency-to-amplitude gain ($kv_{pa}$) block 200. $kv_{ap}$ and $kv_{pa}$ are modeled as negative gains (i.e., the "−" marks near summing blocks 180 and 194) since an increase in either the frequency or the amplitude generally decreases the other.

The behavior of the conventional PLL circuit can be modeled using the following equations.

$$Z_{F1}(s) = \frac{s(R_1 C_1) + 1}{s^2(R_1 C_1 C_2) + s(C_1 + C_2)} \tag{8}$$

$$Z_{F2}(s) = \frac{K_{const}}{s\left(\frac{C}{gm}\right)_{peak} + 1} \tag{9}$$

$$\theta_0 = \frac{1}{s}[kv_{pp}I_{c1} - kv_{ap}I_{c2}] \tag{10}$$

$$A_0 = kv_{aa}I_{c2} - kv_{pa}I_{c1} \tag{11}$$

$$I_{c1} = \left(\frac{I_p}{2\pi}gm_p Z_{F1}(s)\right)\left(\theta_i - \frac{\theta_0}{N}\right) \tag{12}$$

$$I_{c2} = (gm_a Z_{F2}(x))(A_1 - A_0) \tag{13}$$

$\theta_0$ can be determined by plugging equations (12) and (13) into equation (10). In rearranged form, the resulting equation is, $$\theta_0 \left[1 + \underbrace{\frac{kv_{pp}I_p gm_p Z_{F1}(s)}{2\pi N s}}_{(F_{00})}\right] = +\left[\underbrace{\frac{kv_{pp}I_p gm_p Z_{F1}(s)}{2\pi s}}_{(F_{01})}\right]\theta_i - \\ \left[\underbrace{\frac{kv_{ap}gm_a Z_{F2}(s)}{s}}_{(F_{10})}\right]A_i + \\ \left[\underbrace{\frac{kv_{ap}gm_a Z_{F2}(s)}{s}}_{(-F_{11})}\right]A_0$$

or, $$F_{00}\theta_0 + F_{11}A_0 = F_{01}\theta_i + F_{10}A_i \tag{14}$$

$A_0$ can be determined by plugging equations (12) and (13) into equation (11). In rearranged form, the resulting equation is, $$A_0\left[\underbrace{1 + kv_{aa}gm_a Z_{F2}(s)}_{(H_{00})}\right] = +\left[\underbrace{\frac{kv_{aa}gm_a Z_{F2}(s)}{s}}_{(H_{01})}\right]A_i - \\ \left[\underbrace{\frac{kv_{pa}I_p gm_p Z_{F1}(s)}{2\pi}}_{(H_{10})}\right]\theta_i +$$

$$\begin{bmatrix} \frac{kv_{pa}I_p gm_p Z_{F1}(s)}{2\pi N} \\ (-H_{11}) \end{bmatrix} \theta_0$$

or, $$H_{00}A_o + H_{11}\theta_0 = H_{01}A_i + H_{10}\theta_i \qquad (15)$$

Combining equations (14) and (15) in a linear algebraic matrix equation form yields, $$\begin{bmatrix} F_{00} & F_{11} \\ H_{11} & H_{00} \end{bmatrix} \begin{bmatrix} \theta_0 \\ A_0 \end{bmatrix} = \begin{bmatrix} F_{01} & F_{10} \\ H_{10} & H_{01} \end{bmatrix} \begin{bmatrix} \theta_i \\ A_i \end{bmatrix}, \text{ or,} \qquad (16)$$

$$\begin{bmatrix} \theta_0 \\ A_0 \end{bmatrix} = \frac{1}{F_{00}H_{00} - F_{11}H_{11}} \begin{bmatrix} H_{00} & -F_{11} \\ -H_{11} & F_{00} \end{bmatrix} \begin{bmatrix} F_{01} & F_{10} \\ H_{10} & H_{01} \end{bmatrix} \begin{bmatrix} \theta_i \\ A_i \end{bmatrix}$$

It is desired to minimize the coupling between the phase/frequency and amplitude control loops. As shown in FIG. 7, this can be accomplished by adding $KI_{C2}$ to $I_{C1}$, as indicated by a K scale factor block 202, a connection line 204, and a summing block 206. The overall effect is that the parasitic gain from the amplitude control loop to the phase/frequency control loop is substantially canceled out. The appropriate value for K can be determined from the following modified equations, wherein ($I_{c1}+KI_{c2}$) has been substituted for $I_{c1}$ in equations 10–11 and 14–16.

$$\theta_0 = \frac{1}{s}[kv_{pp}(I_{c1} + KI_{c2}) - kv_{ap}I_{c2}] = \frac{1}{s}[kv_{pp}I_{c1} + (Kkv_{pp} - kv_{ap})I_{c2}] \qquad (10')$$

$$A_0 = kv_{aa}I_{c2} - kv_{pa}(I_{c1} + KI_{c2}) = (kv_{aa} - Kkv_{pa})I_{c2} + kv_{pa}I_{c1} \qquad (11')$$

$$I_{c1} = \left(\frac{I_p}{2\pi}gm_p Z_{F1}(s)\right)\left(\theta_i - \frac{\theta_0}{N}\right) \quad \text{(REMAINS THE SAME)} \qquad (12)$$

$$I_{c2} = (gm_a Z_{F2}(s))(A_1 - A_0) \quad \text{(REMAINS THE SAME)} \qquad (13)$$

Figure 8:
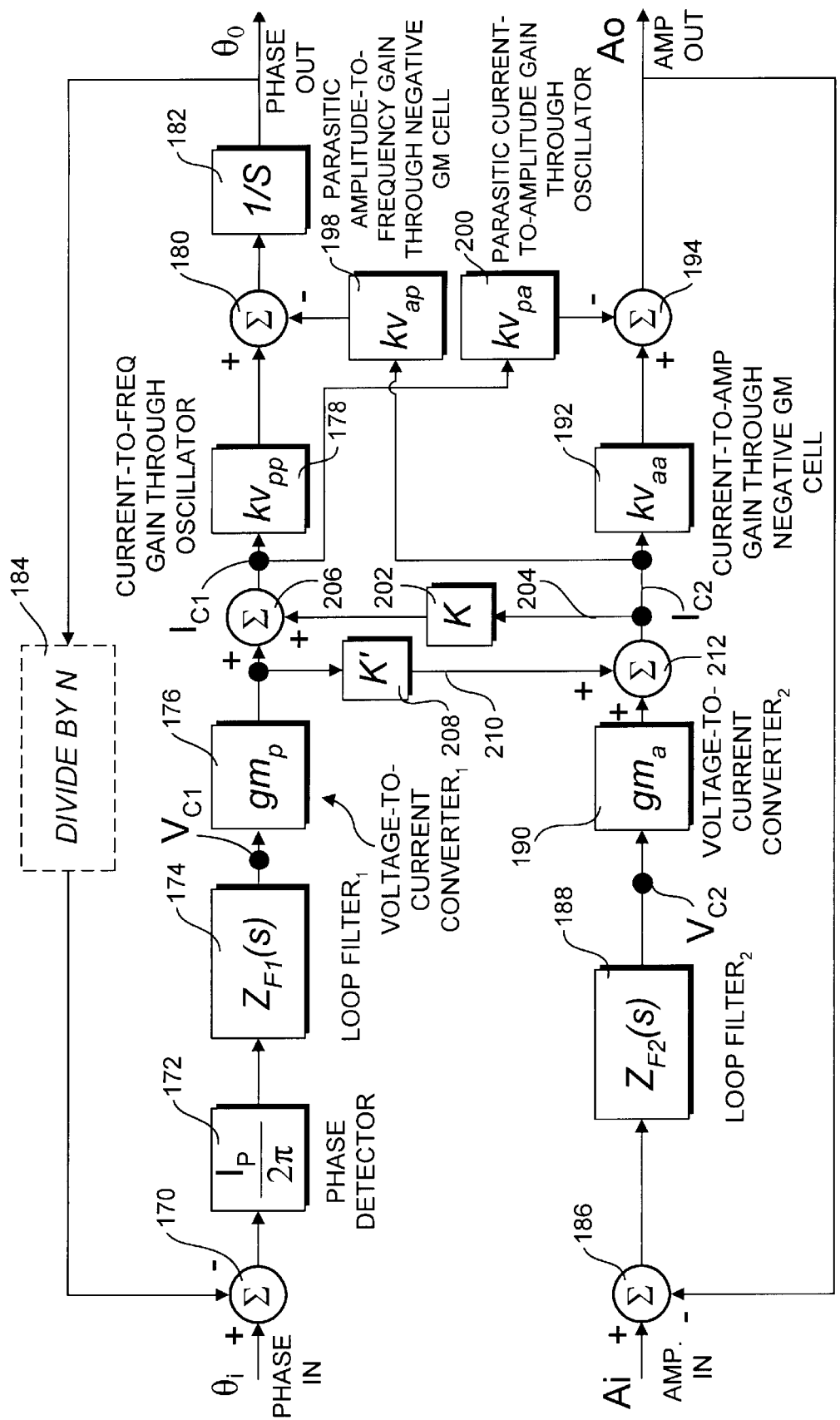
FIG. 8 is a schematic block diagram for modeling the behavior of a modified charge pump PLL circuit in accord with a second exemplary implementation of the present invention.

It turns out that $kv_{pp}$ and $kv_{ap}$ are of the same order. From equation 10', it would be desirable to have ($Kkv_{pp}-kv_{ap}=0$) to eliminate the cross-coupling effect. However, testing has revealed that the effect of $kv_{pa}$ is insignificant, i.e., $kv_{pa} \ll kv_{aa}$. Alternatively, if it is desired not to ignore the effect of $kv_{pa}$, the appropriate equation is ($K'kv_{aa}-kv_{pa}=0$). This can be modeled by adding a second "K'" scale factor block 208 disposed along a connection 210 that connects $I_{c1}$ to $I_{c2}$ through a summing block 212, as shown in FIG. 8. In this instance, the foregoing equations 10–16 would be solved by replacing $I_{c2}$ with $I_{c2}+K'I_{c1}$.

If the effects of $kv_{pa}$ are ignored, the matrix equations become, $$F'_{10} = \frac{F_{10}(kv_{ap} - Kkv_{pp})}{kv_{ap}} \qquad (17)$$

$$F'_{11} = \frac{F_{11}(kv_{ap} - Kkv_{pp})}{kv_{ap}} \qquad (18)$$

$$H'_{00} = \left[(H_{00} - 1)\frac{(kv_{aa} - Kkv_{pa})}{kv_{aa}}\right] + 1 \qquad (19)$$

$$H'_{01} = \frac{H_{01}(kv_{aa} - Kkv_{pa})}{kv_{aa}} \qquad (20)$$

$$\begin{bmatrix} \theta_0 \\ A_0 \end{bmatrix} = \frac{1}{F_{00}H'_{00} - F'_{11}H_{11}} \begin{bmatrix} H'_{00} & -F'_{11} \\ -H_{11} & F_{00} \end{bmatrix} \begin{bmatrix} F_{01} & F'_{10} \\ H_{10} & H'_{01} \end{bmatrix} \begin{bmatrix} \theta_i \\ A_i \end{bmatrix} \qquad (16')$$

As discussed above, by adjusting the value of K relative to the values of $kv_{aa}$ and $kv_{pa}$ (i.e., such that $Kkv_{pp}-kV_{ap}\approx 0$), the parasitic coupling effect of the amplitude loop onto the phase/frequency loop can be substantially eliminated. As a result, control of the amplitude and phase/frequency control loops are decoupled, enabling the frequency to be controlled independently of the amplitude.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Accordingly, it is not intended that the scope of the invention in any way be limited by the above description, but instead be determined entirely by reference to the claims that follow.

What is claimed is:

1. A method for stabilizing a phase/frequency control loop in the presence of an amplitude control loop in a phase locked loop circuit, comprising:

determining a first parasitic gain that is coupled from the amplitude control loop into the phase/frequency control loop; and inserting a first inverse gain into the phase/frequency control loop that is substantially equal to the first parasitic gain and opposite thereto to cancel the effect of the first parasitic gain by summing a scaled amount of an amplitude control current used to control the amplitude control loop into a phase/frequency control current used to control the phase/frequency control loop.

2. The method of claim 1, wherein the phase locked loop circuit includes a gm (transconductance)-C relaxation-type oscillator that is common to both of the phase/frequency and amplitude control loops.

3. The method of claim 2, wherein the gm-C relaxation-type oscillator comprises two cascaded gm stages that provide 180 degrees of phase shift.

4. The method of claim 3, wherein the phase locked loop circuit has an oscillation cycle and produces an oscillation having an amplitude, and wherein each gm stage is loaded with a net negative gm circuit that produces a net negative amount of transconductance at its output to compensate for resistive losses, initiate the oscillation cycle, and set the oscillation amplitude.

5. The method of claim 4, wherein each net negative gm circuit comprises m source-coupled cross-connected differential pairs with resistive loads in parallel with n source coupled diode-connected differential pairs with resistive loads, wherein m>n.

6. The method of claim 5, wherein the resistive loads are produced by saturated PMOS transistors.

7. The method of claim 1, further comprising:

determining a second parasitic gain that is coupled from the phase/frequency control loop into the amplitude control loop; and inserting a second inverse gain into the amplitude control loop that is substantially equal the second parasitic gain and opposite thereto to cancel the effect of the second parasitic gain.

8. The method of claim 7, wherein the phase/frequency control loop is primarily controlled as a function of a phase/frequency control current and the amplitude control loop is primarily controlled as a function of an amplitude control current, and further wherein the second inverse gain is produced by summing a scaled amount of the phase/frequency control current into the amplitude control current.

9. A phase locked loop circuit comprising:
a phase/frequency control loop including a gm (transconductance)-C relaxation-type oscillator that produces an output signal having a frequency corresponding to a frequency control signal;
an amplitude control loop including the gm-C relaxation-type oscillator such that the output signal has an amplitude corresponding to an amplitude control signal, said amplitude control loop coupling a parasitic gain into the phase/frequency control loop and providing an inverted gain in opposite to the parasitic gain to the phase/frequency control loop to substantially cancel the effect of the parasitic gain such that control of the phase/frequency of the phased locked loop circuit is decoupled from control of the amplitude of the phase locked loop circuit.

10. The phase locked loop circuit of claim 9, wherein the gm-C relaxation-type oscillator comprises two cascaded gm stages that provide 180 degrees of phase shift.

11. The phase locked loop circuit of claim 9, wherein the phase locked loop circuit has an oscillation cycle and produces an oscillation having an amplitude, and wherein each gm stage is loaded with a net negative gm circuit that produces a net negative amount of transconductance at its output to compensate for resistive losses, initiate the oscillation cycle, and set the oscillation amplitude.

12. The phase locked loop circuit of claim 11, wherein each net negative gm circuit comprises m source-coupled cross-connected differential pairs with resistive loads in parallel with n source coupled diode-connected differential pairs with resistive loads, wherein m>n.

13. The phase locked loop circuit of claim 12, wherein the resistive loads are produced by saturated PMOS transistors.

14. A phase locked loop circuit comprising:
a phase/frequency control loop including:
a phase detector;
an integrator;
a first loop filter;
a first voltage to current converter; and
a current-controlled oscillator; and
an amplitude control loop including:
a peak detector/comparator;
a second loop filter;
a second voltage-to-current converter; and
the current-controlled oscillator,
wherein a parasitic gain is coupled from the amplitude control loop into the phase/frequency control loop and an inverted gain is inserted into the phase/frequency control loop opposite to the parasitic gain to substantially cancel the effect of the parasitic gain such that control of the phase/frequency control loop is decoupled from the amplitude control loop.

15. The circuit of claim 14, wherein the parasitic gain comprises a parasitic current coupled from the amplitude control loop into the phase/frequency control loop, and the current-controlled oscillator comprises:
a first transconductance (gm) stage having an input and output;
a second gm stage connected to the output of the first gm stage;
an inverter, having an input connected to the output of the second gm stage and an output connected to the input of the first gm stage to form a feedback loop;
a first net negative gm circuit connected to the output of the first gm stage; and
a second net negative gm circuit connected to the output of the second gm stage.

16. The circuit of claim 13, wherein each of the first and second net negative gm circuits comprise m source-coupled cross-connected differential pairs with resistive loads in parallel with n source coupled diode-connected differential pairs with resistive loads, wherein m>n.

17. The circuit of claim 14, wherein the resistive loads are produced by saturated PMOS transistors.

* * * * *